(12) United States Patent
Kostka et al.

(10) Patent No.: US 8,865,487 B2
(45) Date of Patent: Oct. 21, 2014

(54) LARGE AREA HERMETIC ENCAPSULATION OF AN OPTOELECTRONIC DEVICE USING VACUUM LAMINATION

(75) Inventors: James Michael Kostka, Cincinnati, OH (US); Edward James Balaschak, Avon, OH (US); Thomas Alexander Knapp, Cleveland, OH (US); John Allie Charny, Richmond Heights, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/237,360

(22) Filed: Sep. 20, 2011

(65) Prior Publication Data
US 2013/0071961 A1    Mar. 21, 2013

(51) Int. Cl.
| H01L 21/00 | (2006.01) |
| H01L 31/048 | (2014.01) |
| H01L 51/44 | (2006.01) |
| B32B 37/00 | (2006.01) |
| B32B 37/10 | (2006.01) |
| H01L 51/52 | (2006.01) |

(52) U.S. Cl.
CPC ............ *B32B 37/003* (2013.01); *H01L 31/048* (2013.01); *B32B 2457/206* (2013.01); *H01L 51/448* (2013.01); *B32B 2457/12* (2013.01); *Y02E 10/549* (2013.01); *B32B 37/1018* (2013.01); *H01L 51/524* (2013.01)
USPC .............................................. 438/26; 438/64

(58) Field of Classification Search
CPC ................................. H01L 31/00; H01L 21/00
USPC ....................................................... 438/26, 64
See application file for complete search history.

(56) References Cited

U.S. PATENT DOCUMENTS

| 6,020,221 | A  * | 2/2000 | Lim et al. ...................... 438/125 |
| 6,149,757 | A    | 11/2000 | Chikaki et al. |
| 6,906,428 | B2 * | 6/2005 | Lehner .......................... 257/778 |
| 7,015,640 | B2   | 3/2006 | Schaepkens et al. |
| 7,208,057 | B2 * | 4/2007 | Weisser .......................... 156/64 |
| 7,397,183 | B2   | 7/2008 | Schaepkens et al. |
| 7,452,750 | B2 * | 11/2008 | Lo et al. ........................ 438/108 |
| 7,583,880 | B2 * | 9/2009 | Anzures et al. ................ 385/129 |
| 7,709,294 | B2 * | 5/2010 | Clare et al. .................... 438/111 |
| 8,158,450 | B1 * | 4/2012 | Sheats et al. .................... 438/57 |
| 2005/0230841 | A1 * | 10/2005 | Walk et al. ..................... 257/778 |
| 2007/0202632 | A1 * | 8/2007 | Lo et al. ........................ 438/108 |
| 2008/0187267 | A1 * | 8/2008 | Anzures et al. ................. 385/14 |
| 2008/0280392 | A1 * | 11/2008 | Stapleton ...................... 438/106 |
| 2009/0267489 | A1   | 10/2009 | Arita et al. |
| 2010/0047962 | A1 * | 2/2010 | Burke et al. ................... 438/107 |

(Continued)

FOREIGN PATENT DOCUMENTS

| JP | 8293131 A | 11/1996 |
| WO | 2008141878 A1 | 11/2008 |

OTHER PUBLICATIONS

PCT Search Report and Written Opinion dated Dec. 21, 2012 from corresponding Application No. PCT/US2012/053884.

*Primary Examiner* — Telly Green
(74) *Attorney, Agent, or Firm* — Global Patent Operation; Peter T. DiMauro

(57) ABSTRACT

Apparatus for accurately picking and placing one or more optoelectronic devices for vacuum lamination of materials in a way that minimizes stress to the materials.

13 Claims, 11 Drawing Sheets

(56) References Cited

U.S. PATENT DOCUMENTS

| | | | |
|---|---|---|---|
| 2010/0296261 A1* | 11/2010 | Gorczyca et al. | 361/820 |
| 2011/0287583 A1* | 11/2011 | Stapleton | 438/109 |
| 2012/0132930 A1* | 5/2012 | Young et al. | 257/84 |
| 2012/0291856 A1* | 11/2012 | Sheats et al. | 136/251 |

\* cited by examiner

LARGE AREA HERMETIC ENCAPSULATION OF AN OPTOELECTRONIC DEVICE USING VACUUM LAMINATION

BACKGROUND OF THE INVENTION

1. Field of the Invention

The field of the invention relates to optoelectronic devices generally, and more particularly to certain new and useful advances in the manufacture of encapsulated optoelectronic devices.

2. Description of Related Art

Optoelectronic devices generally comprise light emitting devices and photovoltaic devices. Both types of optoelectronic devices comprise an active layer sandwiched between two electrodes, at least one of which is usually transparent in a light emitting device, a voltage applied between the two electrodes generates electrical current through the active layer, which causes the active layer to emit light. In a photovoltaic device, such as a solar cell, the active layer absorbs energy from light and converts this absorbed energy to electrical energy, which is evidenced as a voltage and/or a current between the two electrodes.

The active layer is either an inorganic or organic electroluminescent material. One type of popular and useful light emitting device is the organic light emitting diode (OLED). Similar to inorganic light emitting diodes (LEDs), OLEDs are also a form of solid state lighting that offer high efficiencies and long lifetimes. An OLED is typically a thin-film structure formed on a substrate comprising glass or transparent plastic. This thin-film structure comprises at least the three layers described above, and may further comprise optional semiconductor layers formed adjacent the active layer. These semiconductor layers may be incorporated to facilitate the injection and transport of holes (positive charge) or electrons (negative charge).

Glass substrates offer transparency and extremely low permeability to oxygen, water vapor and/or other reactive species, which can cause corrosion and/or degradation of the optoelectronic device; but are typically not suitable for applications where flexibility is required. Plastic substrates offer flexibility and the potential for low cost roll-to-roll production, but typically have a high permeability to oxygen, water vapor and/or other reactive species. Accordingly, OLED devices comprising plastic substrates are typically encapsulated with one or more layers of barrier films that block oxygen, water vapor and/or other reactive species. The composition and methods of making conventional ultra-high barrier (UHB) films, or UHBs, are described in U.S. Pat. No. 7,015,640 and U.S. Pat. No. 7,397,183, both assigned to the General Electric Company.

Many optoelectronic functional materials that are currently used are extremely sensitive to oxygen and moisture, and it is therefore necessary to hermetically seal the devices under an inert environment. This is typically done in a dry box, with purified nitrogen or argon as the working gas. It is preferable to have oxygen and moisture contents below 110 parts per million during the encapsulation process, although this is not deemed to be limiting.

OLEDs, their barrier films and/or backsheets can be damaged in conventional roll-to-roll manufacturing. This is of particular concern for the barrier film that is used to hermetically seal the OLED, as damage induced during a roll-to-roll process may cause defects concomitant with an increased permeability of the films. This will result in a decreased shelf life of the encapsulated device. For example, FIG. 1 illustrates bi-directional compressive forces 13 and 14 that are applied during a conventional roll fabrication process to a conventional OLED device 10 that is sandwiched between a UHB 11 and a backsheet 12. The compressive forces 13 and 14 are exerted on the UHB 11 and the backsheet 12 towards the OLED device 10 by opposing, parallel rollers (not shown) of a conventional roll laminator. This causes the UHB 11 and/or the backsheet 12 to deform to create an edge seal around the OLED device 10. However, deformation of the UHB 11 around the perimeter of the OLED device 10 can create stress areas 15. Over time, portions of these stress areas 15 may exhibit cracking of the UHB 11 and/or loss of its barrier properties. Thus, there is a need for an improved thin flexible packaging technology for expanded application of low cost production of encapsulated optoelectronic devices.

Currently, manufacturing capabilities and material property limitations constrain the size of individual organic light emitting devices (OLEDs) to a relatively small dimension. By relatively small dimension is meant an area on the order of centimeters squared, when contrasted with a large area lighting panel greater than this on the order of feet squared or meter squared. Therefore, in order to obtain large area lighting panels, individual OLEDs need to be tiled together to form the larger product.

Also needed are new tiling and encapsulation equipment and processes that do not diminish OLED performance, and can produce large-area lighting products within a relatively short cycle time.

BRIEF SUMMARY OF THE INVENTION

The present disclosure describes embodiments of a vacuum laminator and lamination techniques for producing large area hermetically encapsulated optoelectronic devices with short cycle times. For example, in one exemplary process, a front sheet is pre-positioned on a flat surface of a heated platen. An optoelectronic device is then positioned on the front sheet using a placement head that transitions between a first convex shape and a second flat shape. This placement operation is done in an evacuated chamber to minimize gas entrapment between the optoelectronic device and front sheet. A backsheet comprising one or more electrical features is then positioned above the optoelectronic device and the front sheet. A diaphragm, which may be pre-heated, then applies compressive force against the backsheet to couple the backsheet with the optoelectronic device and the front sheet, thereby producing either a large area, hermetically sealed optoelectronic device or a plurality of hermetically-sealed optoelectronic devices, which may be tiled or not. Advantageously, this improved technique reduces or prevents damage or stress of the front sheet at a perimeter of the optoelectronic device, which is typically caused using conventional lamination techniques.

An embodiment of a vacuum laminator comprises a first assembly, a second assembly, a third assembly, and a fourth assembly. The first assembly is an optoelectronic placement assembly. The second assembly is a materials assembly. The third assembly is a lamination assembly. The fourth assembly is a support assembly that couples with the first assembly and the third assembly.

An embodiment of a vacuum laminator may comprise one or more placement heads that transition from a first convex shape to a second flat shape in response to an applied compressive force. Advantageously, such placement heads couple the optoelectronic device to the front sheet in such a way that gas is squeezed out from between the optoelectronic device and the front sheet during placement. This, along with the placement operation being performed under vacuum, eliminates gas-bubble entrapment which can create a decrease in performance and aesthetically dissatisfying products.

One benefit is that an embodiment of the laminator and process disclosed herein enables large-area tiling and hermetic encapsulation of semiconductor devices, which results in products with fewer manufacturing defects and superior shelf life characteristics.

Another benefit is increased adhesive options that can be used in the process disclosed.

Yet another benefit is accurate placement and fill-factor optimization that results from the design of the laminator.

Beneficial features that enable accurate alignment of electrical features for large-area optoelectronic device tiling and encapsulation comprise lost motion in the laminator, framing of the backsheet and front sheet, and/or incorporation of device placement pockets. Lost motion occurs when one actuator drives or causes two movements in the same plane. For example, in one embodiment, a shroud that surrounds one or more placement heads has a different distance of travel than the placement heads. Accordingly, the entire first assembly (placement heads and shroud) can be moved together. Depending on the configuration, either the placement heads or the shroud reach a first limit of travel, while the other continues moving until a second limit of travel is reached.

Other benefits comprise placing the optoelectronic device onto the front sheet while under vacuum so that gas bubble entrapment and/or wrinkle generation are minimized; having a pickup head that changes shape during placement to squeeze gas from between an optoelectronic device and the front sheet; and incorporating lost motion to reduce material deflection prior to lamination.

Other advantageous features comprise using pressure balance so that the platen, which comprises high thermal conductivity materials, has a minimal thermal mass; one or more cooling passages formed in the platen through which a coolant can be passed to rapidly cool the platen between laminations; and one or more platen heaters that can be moved toward the platen to heat it prior and/or during lamination and away from the platen after lamination to allow the platen to cool quickly.

Still other features and advantages of the disclosure will become apparent by reference to the following description taken in connection with the accompanying drawings.

BRIEF DESCRIPTION OF THE SEVERAL VIEWS OF THE DRAWINGS

Reference is now made briefly to the accompanying drawings, in which.

DETAILED DESCRIPTION OF THE INVENTION

Figure 1:
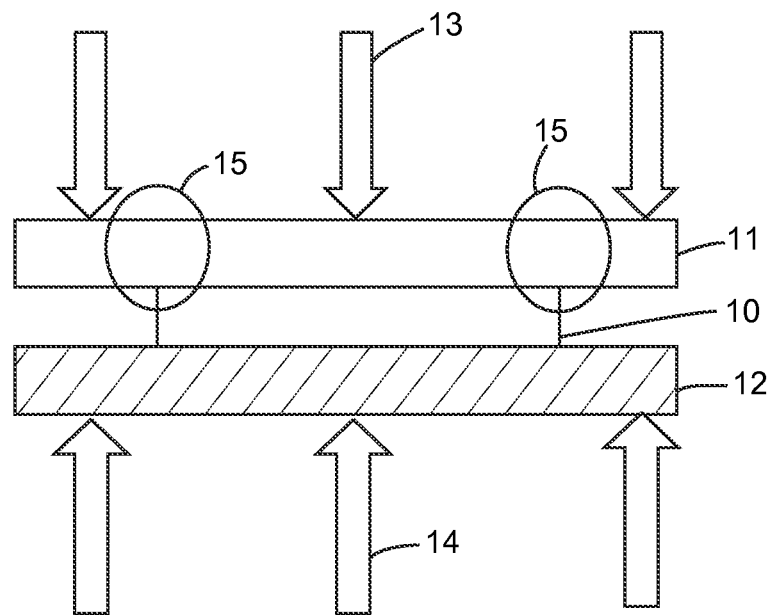
FIG. 1 is a diagram illustrating bi-directional compressive forces applied to a backsheet and a barrier film of an OLED device by opposing rollers of a conventional roll laminator.
Figure 2:
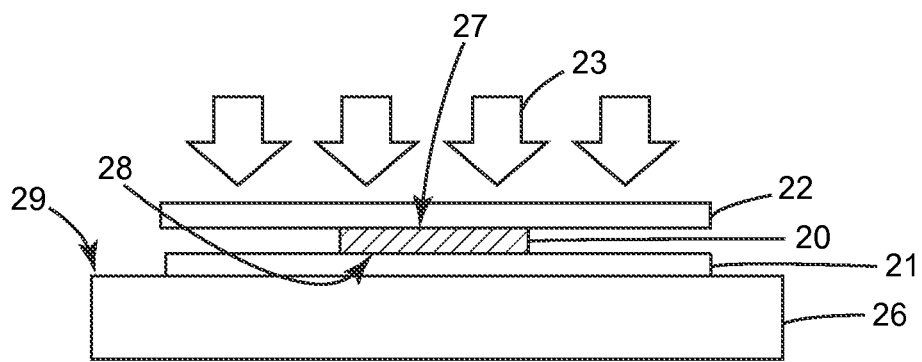
FIG. 2 is a diagram illustrating nearly uni-directional compressive forces applied to a backsheet of an OLED device by an embodiment of a new vacuum laminator.
Figure 3:
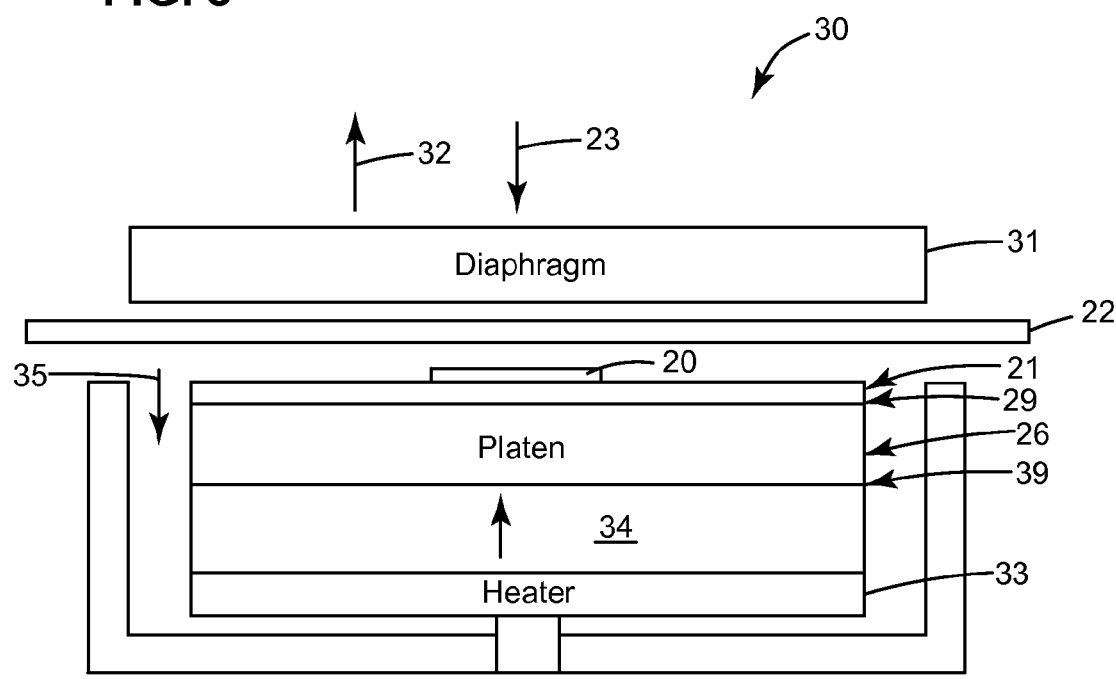
FIG. 3 is a simplified diagram illustrating components that may comprise an embodiment of the vacuum laminator.

FIG. 2 is a diagram illustrating compressive forces 23 applied to a backsheet 22 of an optoelectronic device 20, such as an OLED device or a photovoltaic device, by an embodiment of a new vacuum laminator (30 in FIG. 3). The optoelectronic device 20 is positioned between the backsheet 22 and a front sheet 21. The front sheet 21 may comprise an ultra-high barrier (UHB) film, an optical coupler, an out-coupling adhesive, and/or an out-coupling film. The backsheet 22 contacts a first surface 27 of the optoelectronic device 20. The front sheet 21 contacts an opposite surface 28 of the optoelectronic device 20 and is positioned on a flat surface 29 of a platen 26.

Accordingly, in contrast to conventional roll lamination techniques, the front sheet 21 remains flat, and only the backsheet 22 is pressured to conform around the perimeter of the optoelectronic device 20. Therefore, the mechanically sensitive front sheet 21 is not subjected to the high stress concentrators that are typically generated using conventional processes. These stresses are still present for the backsheet 22, but do not cause defects in it. This is due to the fact that backsheets are typically made from mechanically robust lidding foils, such as Tolas TPC-0814B. Such materials comprise a multi-layer composite, which has a relatively thick (approximately 25 micrometers) layer of metal foil in the inner most layer. Not only does the metallic layer provide the backsheet 22 with excellent barrier properties, but the thickness and ductility of the metal makes it less prone to cracking and degradation under the applied stress, and thus can withstand the resultant deformation from the lamination much more effectively than the front sheet 21.

The platen 26 may comprise a high thermally conductive material to maximize temperature uniformity and reduce cooling times and/or cycle times. In one embodiment the platen 26 comprises a metal, a metal alloy, or a combination thereof. In one example, the platen 26 is made of a copper beryllium alloy.

FIG. 3 is a simplified diagram illustrating components that may comprise an embodiment of a vacuum laminator 30. For example, the vacuum laminator 30 comprises a platen 26 and an opposing diaphragm 31. In one embodiment, the platen 26 is stationary, and the diaphragm 31 applies a compressive force 23 to a backsheet 22 of optoelectronic device. This compressive force 23, like any force is comprised of one or more vectors. Preferably, a vector that is substantially orthogonal to the front sheet 21 and/or the platen 26 has the greatest magnitude. In such an embodiment, the compressive force 23 may be said to be uni-directionat, which is in contrast to the bi-directional forces applied using conventional roll lamination. In response to at least the force 23 applied by the diaphragm 31, the backsheet 22 conforms around the optoelectronic device 20 and adhesively seals to the front sheet 21, thus hermetically sealing the optoelectronic device 20. The optoelectronic device 20 may be a light emitting device, such as an OLED.

As further described below, the backsheet 22 may be positioned in a frame (not shown in FIG. 3) and held in place above the optoelectronic device 20 and front sheet 21 by means of locator pins (not shown in FIG. 3) around the periphery of the platen 26. The frame keeps the backsheet 22 taut to prevent premature contact of the backsheet 22 with adhesive that may be present on the front sheet 21. Additionally, very good alignment of the electrical features on the backsheet 22 with the optoelectronic device 20 can be achieved by using the locator pins and a solid frame. The front sheet 21 can be positioned in another frame (not shown) to ensure that it is held flat against the platen 26.

In the preferred embodiment, there are three chambers in which vacuum and positive pressure can be applied. First chamber 32 allows the diaphragm 31 to pull away from the laminated materials at the end of the cycle, and is also where compressive force 23 is exerted by means of an external pressurized gas supply. Second chamber 34 is used to balance the compressive force 23 that is applied during lamination. Typical lamination pressures range from about 1 psi to about 300 psi, but even pressures in a range of about 10 psi to about 75 psi, generate significant toads across large area panels. By being able to balance one or more compressive forces applied to the platen 26, its thickness can be minimized, thus reducing the thermal mass of the system, which is advantageous for fast heating and cooling rates that are desired in order to achieve a short cycle time. A third chamber 35 removes the gas that is present between the backsheet 22 and front sheet 21 to enable better seal quality. Compressive force 23 is the slim of the positive pressure applied in the first chamber 32 and the vacuum level applied in the third chamber 35. The chambers 32, 34 and 35 may couple with the same vacuum source or with different vacuum sources, and may also couple with the same external gas supply for positive pressure or with different gas supplies.

One or more heaters 33 provide thermal energy to a flat surface 29, 39 of the platen 26. The flat surface 29 is a top surface of the platen 26, which is positioned proximate the front sheet 21. In one embodiment the heater is permanently fixed to the bottom surface 39 of the platen 26. In another embodiment the heater 33 has the capability of being moved into and out of physical contact with bottom surface 39 of platen 26. In yet another embodiment, a heater is either temporarily or permanently in contact with diaphragm 23, allowing heat to be applied from the other side of the materials as well. The one or more heaters 33 can be operated to control the temperature of the encapsulation process, and can quickly cure one or more layers of heat-cure adhesive (not shown) to affix and/or seal the backsheet 22 to the front sheet 21 and the optoelectronic device 20.

In use, and in contrast to the conventional roll laminator previously described, the vacuum laminator 30 uses a combination of vacuum, pressure and thermal energy to reduce wrinkles and/or tears in the backsheet 22 and/or the front sheet 21. Pressure applied through first chamber 32 and the diaphragm 31 smooths the backsheet 22 against the diaphragm 31. Applying pressure to the backsheet 22 though the diaphragm is advantageous because it allows the backsheet 22 to be pressed against the optoelectronic device 20 and the front sheet 21 from the center outwards towards the sides or edges the laminated panel, thus squeezing out any additional gas that may be present. This is due to the fact that the diaphragm naturally deflects in the center, to create a convex curve, when under external pressure, because the center is the farthest distance from where the diaphragm is secured to the rest of the assembly. Evacuating the gas between the layers via chamber 35 prior to the application of compressive force 23, enables a wider selection of adhesives to be utilized on the backsheet 22 and front sheet 21. Specifically it enables the utilization of pressure sensitive adhesives, which normally would trap gas bubbles in between the films if not evacuated before the lamination.

Figure 4:
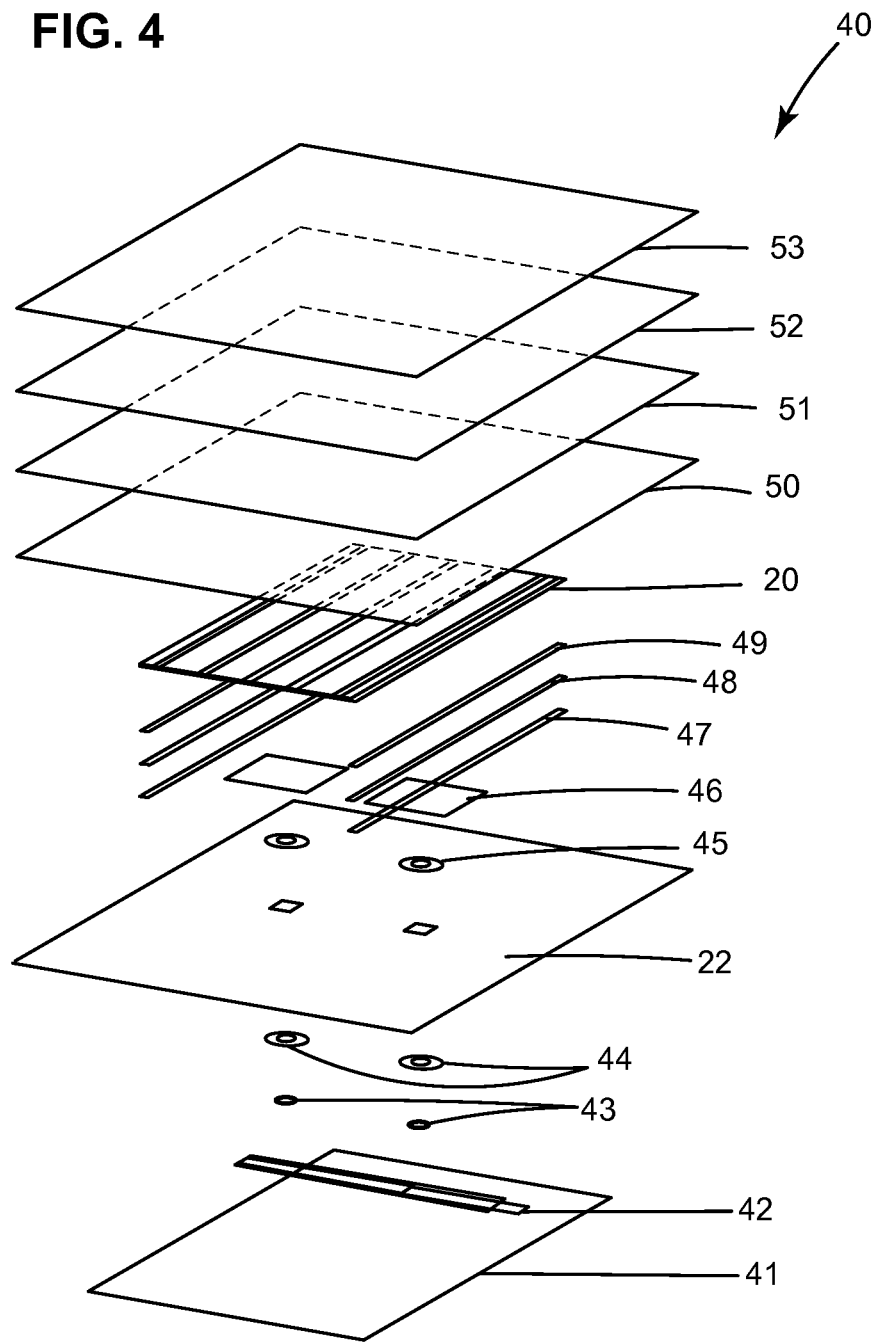
FIG. 4 is a perspective, exploded view of a type of encapsulated optoelectronic device that can be manufactured by an embodiment of the vacuum laminator of FIG. 3 and FIG. 5 and following.
Figure 5:
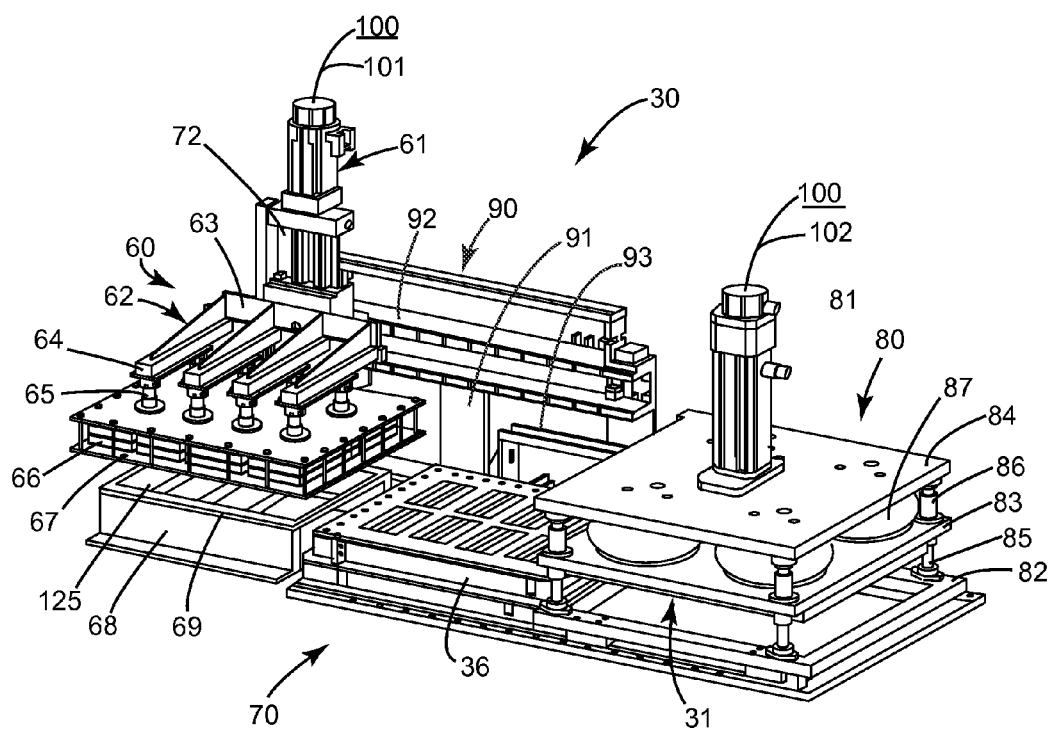
FIG. 5 is a perspective view of an embodiment of the vacuum laminator.

FIG. 4 is a perspective, exploded view of an encapsulated optoelectronic device 40 that can be manufactured by an embodiment of the vacuum laminator 30 of FIG. 3 and FIG. 5 and following. By way, of example only, and not limitation, the optoelectronic device 20 comprises an organic light emitting diode (OLED). The vacuum laminator 30 can also manufacture other encapsulated optoelectronic devices 20, such as photovoltaic devices.

From bottom to top of FIG. 4, the exemplary encapsulated optoelectronic device 40 comprises a mask 41, a flat flex cable 42, low temperature solder 43, first insulating rings 44, a backsheet 22, second insulating rings 45, contact patches 46, first anisotropic conductive film (ACF) strips 47, a supplemental bus 48, second ACF strips 49, an OLED 20, an optical coupler 50, a barrier film 51, an out-coupling adhesive 52, and an out-coupling film 53. In one embodiment the backsheet 22 has a thermally activated or pressure sensitive adhesive on the surface closest to the OLED 20.

In one embodiment, some or all of these components are pre-assembled, compressed, and adhered together prior to encapsulating the optoelectronic device 20. For example, the optical coupler 50, the barrier film 51, the out-coupling adhesive 52, and the out-coupling film 53 may be pre-assembled to form a single "front sheet" (21 in FIG. 3) to which the optoelectronic device 20 can be affixed. Similarly, the first insulating rings 44, the backsheet 22, second insulating rings 45, contact patches 46, first anisotropic conductive film (ACT) strips 47, supplemental bus 48, second ACF strips 49 can be pre-assembled. In one embodiment the flat flex cable 42 is soldered to the patches 46 after the OLED 20 is hermetically sealed, and then the mask 41 is applied. In another embodiment the mask 41, the flat flex cable 42, low temperature solder 43, the first insulating rings 44, the backsheet 22, second insulating rings 45, contact patches 46, first anisotropic conductive film (ACT) strips 47, supplemental bus 48, second ACF strips 49 are all pre-assembled. The added thickness of the flat flex cable and other elements in this pre-assembly would create large stress concentrators in roll lamination, but due to the conformable nature of the diaphragm in vacuum lamination it is now possible to laminate aft of the components as a pre-assembly. In one embodiment the barrier film 51 is made of glass, for example borosilicate glass or soda lime glass. To maintain the thin nature of the laminated assembly, the preferred thickness for the glass is from about 0.1 mm to about 2.0 mm.

FIG. 5 is a perspective view of an embodiment of the vacuum laminator 30. From left to right in FIG. 5, the vacuum laminator 30 comprises a first assembly 60, a second assembly 70 and a third assembly 80. The vacuum laminator 30 further comprises a fourth assembly 90. In FIG. 5, this fourth assembly is positioned behind the first, second and third assemblies 60, 70 and 80, respectively.

The first assembly 60 has several functions. One is, using vacuum pressure, to pick up one or more optoelectronic devices from one or more corresponding pockets 125 in a placement plate 69 that is positioned on a frame 68. Other functions of the first assembly 60 are to move laterally along a support rail 92 of the fourth assembly 90, and to accurately place the one or more optoelectronic devices on a front sheet positioned on the second assembly 70. Vacuum applied prior to placement and/or before lamination of the optoelectronic device(s) ensures that no gas is trapped during coupling of the optoelectronic devices (s) to the front sheet.

In one embodiment, an optoelectronic device 20 can be placed within a tolerance of plus or minus 0.1 mm, and individual optoelectronic devices can be spaced as closely as about 1.0 mm apart from each other. As previously described there are many electrical features on the backsheet 22 and optoelectronic device 20 that need to be accurately aligned with each other, and this placement tolerance is critical to enable large area tiling. Additionally, it is advantageous from an application perspective to maximize the factor of the tiled panel, which for a tiled OLED panel is the proportion of the surface area that is illuminated or emits light relative to the total surface area of the panel. By having the capability of placing each optoelectronic device in close proximity as described, impressive fill factor values can be obtained. The optoelectronic devices are originally aligned using the placement plate 69, which may optionally comprise one or more guides (not shown) used to accurately position the optoelectronic device for pick-up by a corresponding placement head 66. In one embodiment guides (not shown) in the frame 68 and/or the placement plate 69 allow it to be easily and accurately changed, such that other tiled configurations can be created.

The first assembly 60 is therefore an optoelectronic device placement assembly. It comprises a first elevational support member 61 that is removably coupled with an optoelectronic device placement head support assembly 62, preferably via a single fastener so that the optoelectronic device placement head support assembly 62 (hereinafter, "pick and place assembly 62") can be removed and attached with one hand, when the vacuum laminator 30 is in a dry box. The pick and place assembly 62 comprises a support member 63 to which one or more support arms 64 are attached, or integrally formed.

Four support arms 64 are illustratively shown in FIG. 5, but any number of support arms may be used. These support arms 64 project substantially orthogonally to the support member 63. The first elevation at support member 61 comprises a vacuum passage 101, which can be coupled with a vacuum source 100. The support arms 64 also comprise a vacuum passage (not shown in FIG. 5) that couples the vacuum passage 101 and with a bore (not shown) of a placement head actuator 65. Two placement head actuators 65 per support arm 64 are illustratively shown, for a total of eight placement head actuators 65 and corresponding placement heads 66, but any number of placement head actuators 65 per support arm 64 may be used. Additionally, in other embodiments, multiple placement heads 66 per placement head actuator 65 can be used.

Figure 6:
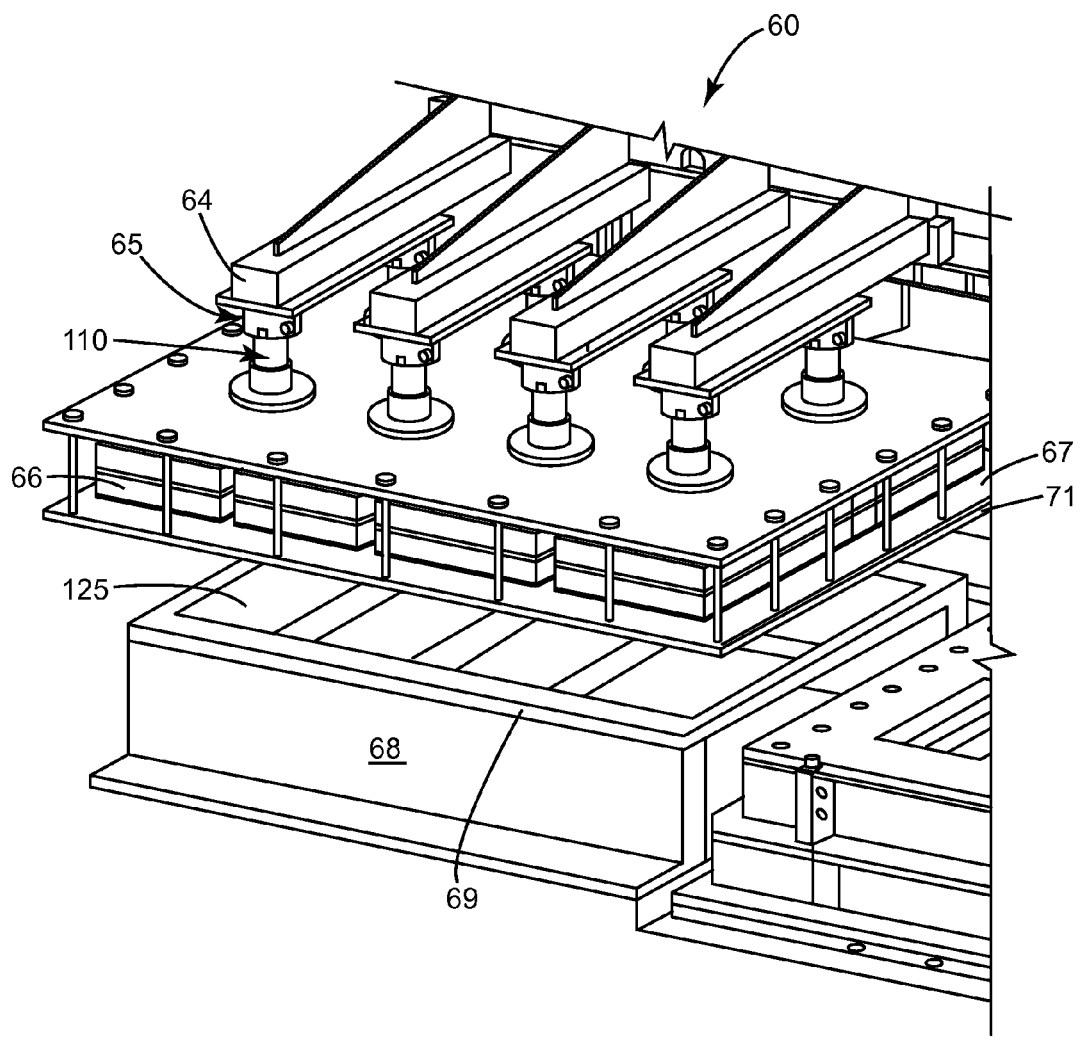
FIG. 6 is a top perspective view of a first assembly of the vacuum laminator of FIG. 5.

FIG. 6 is a top perspective view of the first assembly 60 of the vacuum laminator 30 of FIG. 5, showing the support arms 64, placement head actuators 65, resilient members 110, placement heads 66, shroud 67, frame 68, placement plate 69, gasket 71, and optoelectronic device pockets 125 in greater detail.

As shown in FIG. 6, each placement head actuator 65 may be spring-loaded with a resilient member 110. As previously described, the first assembly 60 moves over to the second assembly 70. Using one stroke in a single plane (e.g., lost motion), an actuator 72 moves the first assembly 60 downward to mate with the second assembly 70. The shroud 67 contacts the platen (or other portion of the second assembly) first, followed by the one or more placement heads 66 (as further explained below). The gasket 71 on the bottom of the shroud 67, which may be translucent, transparent or opaque, comes into contact with the gasket 38 of the second assembly, thus creating a seal. A vacuum is then pulled to evacuate the gas within the trapped volume defined by the shroud 67, prior to placing the optoelectronic device(s) 20 onto the front sheet 21.

After the appropriate vacuum level is obtained, the placement head support assembly 62 is then moved downward by the actuator 72 (FIG. 5), thereby compressing the resilient member 110, and the optoelectronic device(s) 20 are thus placed on the front sheet 21 white under vacuum. The actuator 72 may be a linear actuator, which is driven by a servo motor. If thermally activated adhesives are utilized, heat is applied via the heater 33 that is in contact with platen 26. Vacuum is then released on the placement heads 66 and the chamber, and the first assembly 60 is returned to the home position over the placement plate 69. In addition to enabling a vacuum to be established prior to placement of the optoelectronic device(s) 20, the resilient member 110 opposes and balances downward movement of the first assembly 60 so that optoelectronic device(s) 20 are not damaged during the pickup operation in receptacles 125, or during the placement operation on the front sheet 21. In one embodiment, the resilient member 110 is a coil spring; but other types of springs may be used.

Figure 7:
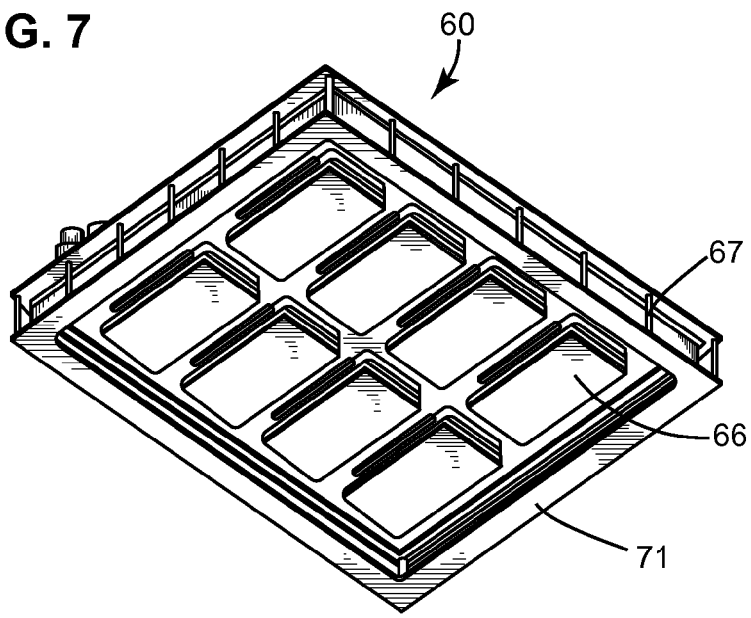
FIG. 7 is a bottom perspective view of the first assembly of FIG. 6.

FIG. 7 is a bottom perspective view of the first assembly 60 of FIG. 6, showing the placement heads 66, shroud 67, and gasket 71. As shown in FIG. 7, the optoelectronic device placement heads 66 are disposed beneath the shroud 67.

Figure 8:
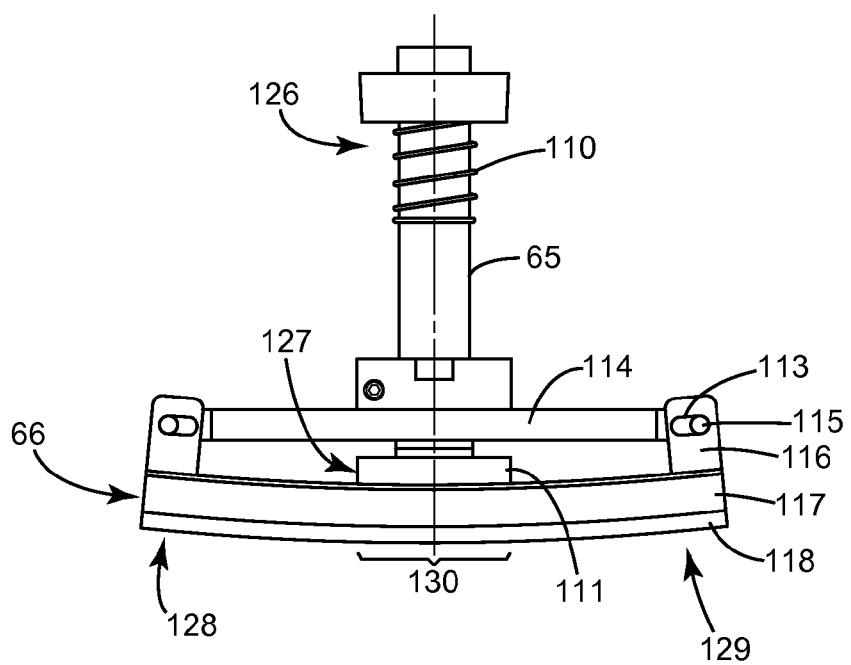
FIG. 8 is a side view of a placement head, which is a component of the first assembly of FIGS. 5, 6, and 7.

FIG. 8 is a side view of a placement head actuator 65, which is a component of the first assembly 60 of FIGS. 5 and 6. A function of the placement head actuator 65 is to hold the placement head 66 in a first shape (convex) until force applied by servo motor 72 changes the placement head 66 to a second shape (flat). Another function of the placement head actuator 65 is to ensure that when placing an optoelectronic device, a center portion 130, of the placement head 66 creates a line contact with the front sheet 21. Upon further downward movement, the placement head 66 holding the optoelectronic device will transition from its first convex shape to its second flat shape, thereby squeezing out any gas that may be present between the optoelectronic device 20 and front sheet 21. Similar to the lamination step, by creating a vacuum prior to the placement of the optoelectronic device, and by pressing from the center outward, it is possible to adhere the optoelectronic device to the front sheet without trapping any gas in the lamination. This enables the use of pressure sensitive adhesives for hermetic sealing purposes.

As shown in FIG. 8, the placement head actuator 65 can be a hollow cylinder. One end 126 of the placement head actuator 65 is coupled with the resilient member 110. The other end 127 of the placement head actuator 65 is coupled with a disk 111. The disk 111 is coupled with a central portion of the placement head 66 to bend the placement head 66 into a convex shape. A pair of support members 112, each containing a hole or slot 113, is coupled with one end 128 of the placement head 66. Another pair of support members 112, each containing a hole or slot 113, is coupled with an opposite end 129 of the placement head 66. Pins 115 extending through bars 114 and the holes or slots 113 and across the ends of the placement head 66 secure the bars 114 to the support members 112. These bars 114 redirect applied compressive force generated by servo motor 72 (FIG. 5) so that the placement head 66 flattens from the central portion 130 outwards to its ends 128 and 129. Each placement head 66 comprises a plate 116, a base 117 and a cover 118.

Figure 9:
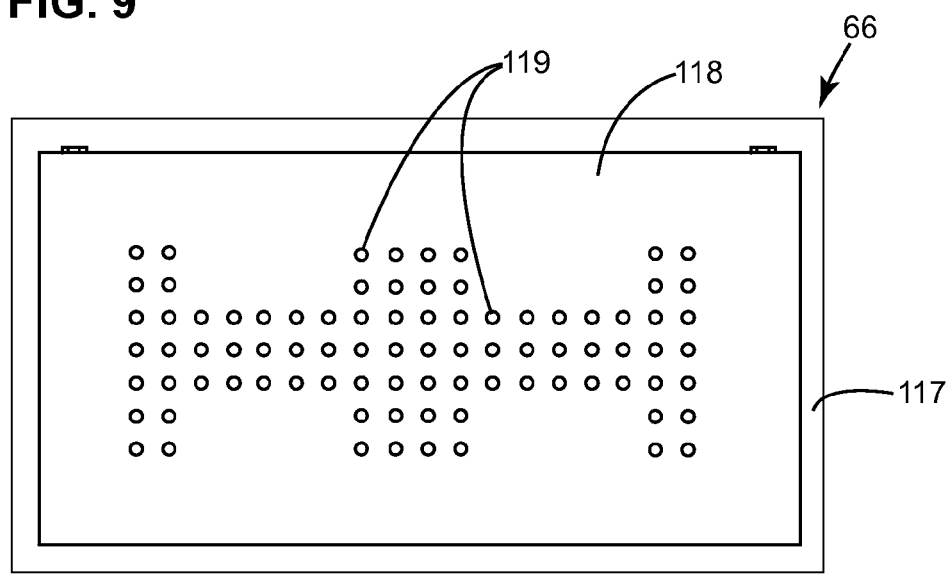
FIG. 9 is a bottom exterior view of a placement head of the first assembly.

FIG. 9 is a bottom exterior view of the placement head 66 of the first assembly 60, showing the base 117 and the cover 118. The cover 118 comprises a first plurality of holes 119 formed therethrough so that vacuum pressure can temporarily affix optoelectronic device 20 to the placement head 66. In one embodiment, the first plurality of holes 119 are arranged as shown in FIG. 9 to achieve maximum vacuum levels and to spread the vacuum evenly across the placement head 66 for consistent pick up and placing.

Figure 10:
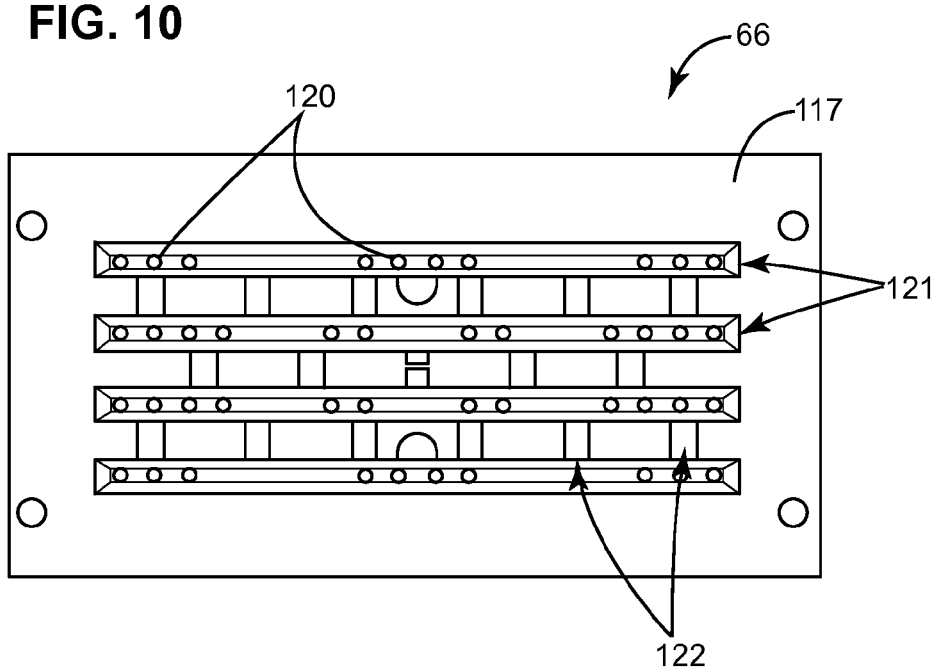
FIG. 10 is a top interior view of the placement head of FIG. 9.

FIG. 10 is a top interior view of base 117 of the placement head 66 of FIG. 9 illustrating a second plurality of holes 120 that are positioned within a plurality of longitudinal channels 121 formed in the base 117. These longitudinal channels 121 are intersected by a plurality of transverse channels 122. This combination and arrangement of the second plurality of holes 120, the longitudinal channels 121, and the transverse channels 122 provide uniform vacuum levels over the placement head 66. Such uniform vacuum levels advantageously ensure that an optoelectronic device is accurately picked up and placed, since shifting during the operation would result in misalignment with the electrical features of the backsheet.

Returning back to the laminator 30 of FIG. 5, the second assembly 70 is a materials assembly. With reference to FIGS. 2 and 5, a function of the second assembly 70 is, using the first frame 130, to hold the front sheet 21 (FIG. 2), against a flat surface (29 in FIG. 2) of a heated platen (26 in FIG. 2). This allows accurate placement and coupling of one or more optoelectronic devices 20 with the front sheet 21. In one embodiment, the second assembly 70 is spring-loaded (37 in FIG. 13). This lost motion allows the backsheet to be initially placed above the front sheet 21 with a sizable gap so that the backsheet (22 in FIG. 2) does not sag and prematurely touch the front sheet 21. Prior to lamination, however, the resilient members 37 may compressed to bring the backsheet 22 closer to the front sheet 21. The gap that separates the backsheet 22 and the front sheet 21 is adjustable and can be optimized and/or changed over time. For purposes of illustration only, the initial gap can be about 0.25", e.g., about 6.35 mm or greater, and the compressed gap can be about 0.25", e.g., 6.35 mm or less. This lost motion minimizes the amount the backsheet 22 needs to deflect, ensuring proper alignment of the electrical features on the backsheet 22 with the optoelectronic devices 20.

Figure 11:
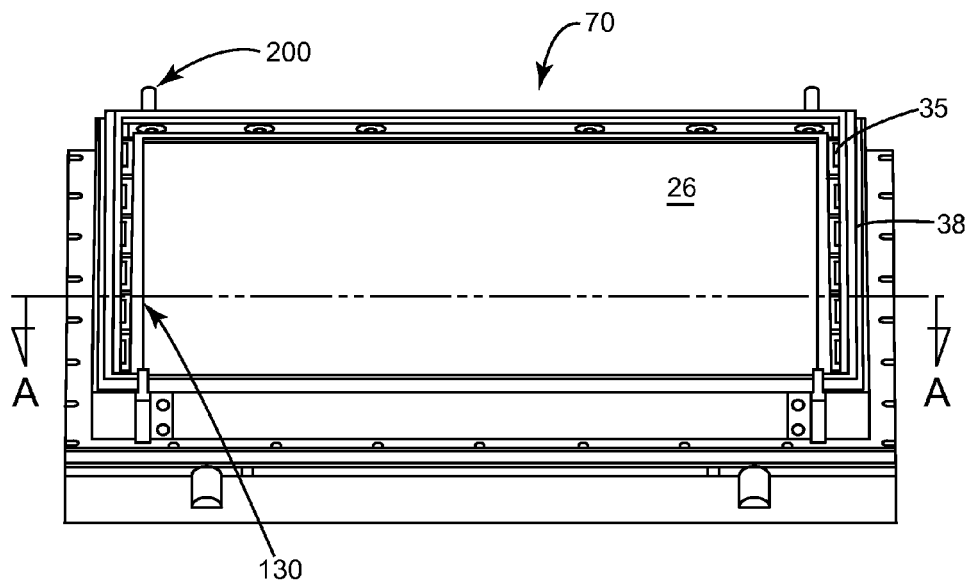
FIG. 11 is a top perspective view of a second assembly of the vacuum laminator of FIG. 5.

FIG. 11 is a top perspective view of the second assembly 70, illustrating a first frame 130 that couples with a front sheet (21 in FIG. 2) that is in contact with platen 26. Pins 200 are used to align a second frame 36 with a backsheet (22 in FIGS. 2 and 13) that is attached to it. As shown, the first frame 130 is encompassed by the second frame 36 that would go on the pins 200 because the first frame 130 is smaller in dimension. The third vacuum channel 35 is formed between the first frame 130 and where the backsheet on the second frame 36 is sealed to gasket 38, and allows for a vacuum to be generated between the top assembly 21 and backsheet as previously described. The plurality of pins 200 are used to ensure that the backsheet is properly aligned with the optoelectronic devices that are placed on the front sheet. One of the pins may be offset to ensure that the orientation of the backsheet on the pins is orientated properly over the optoelectronic devices that are tiled in non-symmetric configurations.

Figure 12:
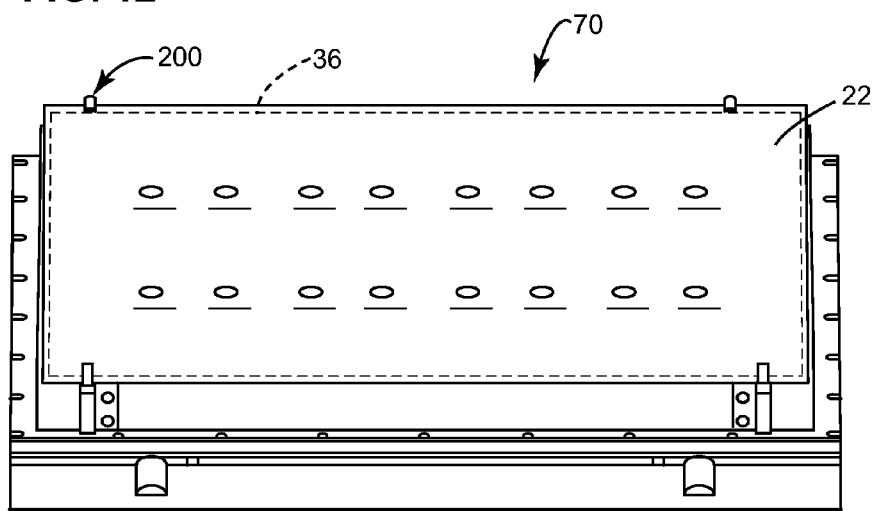
FIG. 12 is a top perspective view of the second assembly of FIG. 11 with a backsheet positioned thereon.

FIG. 12 is a top perspective view of second assembly 70 of FIG. 11 with the framed backsheet 22 placed on pins 200. In one embodiment, both the front sheet (21 in FIGS. 2 and 3) and the backsheet 22 are coupled with their respective frames prior to entering a dry box. This helps material handling in dry box gloves and ensures the front sheet and backsheet 22 are held as flat as possible to ensure proper alignment.

Figure 13:
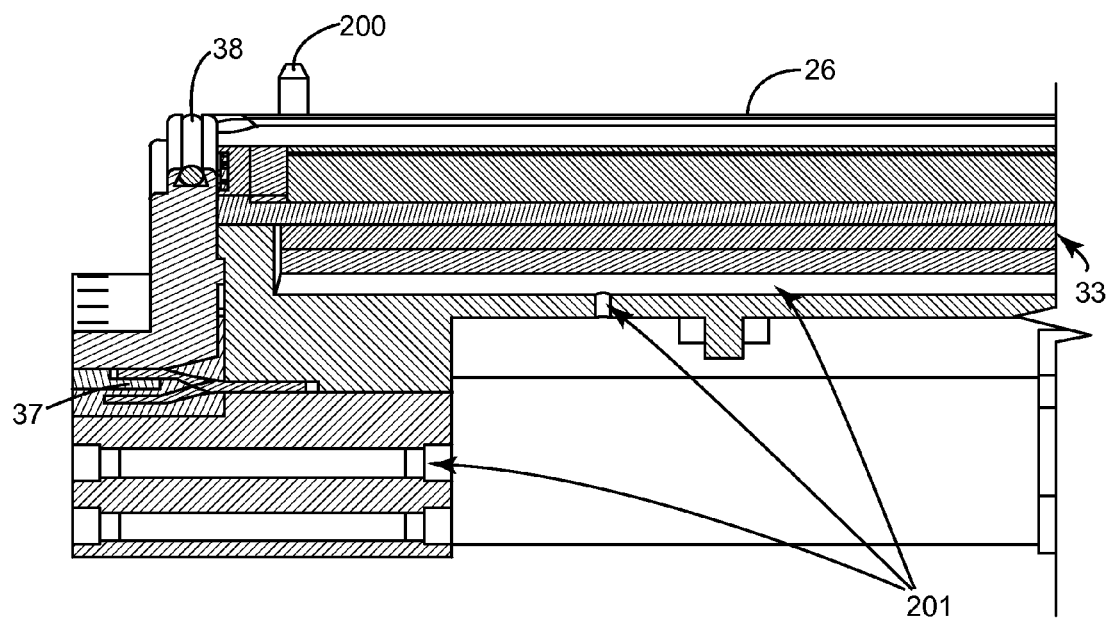
FIG. 13 is a cross-sectional view of the second assembly of FIG. 11 taken along the line A-A'.

FIG. 13 is a cross-sectional view of the second assembly 70 of FIG. 11 taken along the line A-A' and illustrating that an embodiment of the platen 26 has one or more cooling passages 201 just below the one or more heaters 33. The one or more heaters 33 can be arranged to warm the platen 26 uniformly. Warming the platen 26 enables tacking one or more optoelectronic devices to the front sheet and/or laminating the front sheet to the backsheet using heat-cure adhesives. To improve cycle time and quickly cool at least the platen 26, a cooling fluid can be passed through the cooling passages 201. In one embodiment the fluid is chilled gaseous nitrogen. In another embodiment chilled water is flowed into a bladder that contacts the bottom surface of the platen 26. In another embodiment liquid nitrogen can be utilized to remove heat via conduction and convection. In FIG. 13, 38 is the gasket described in FIGS. 11, and 37 is the resilient member that provides lost motion during lamination.

Referring back to FIG. 5, the third assembly 80 is a lamination assembly. The third assembly 80 has several functions. One is to move from a first position that is away from the second assembly 70 to a second position that is over the second assembly 70. Another is to apply vacuum and/or external pressure, and optionally heat, to the diaphragm 31. Another function of the third assembly 80 is to apply substantially uniform compressive force (23 in FIGS. 2 and 3) against the backsheet to couple it with the front sheet.

Figure 14:
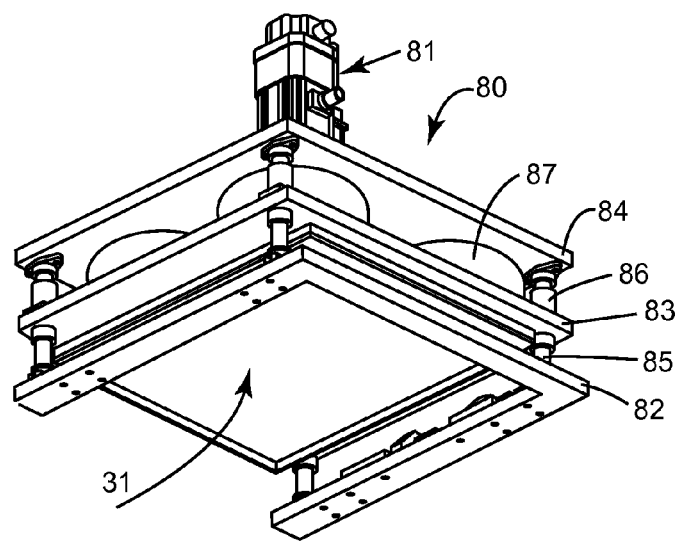
FIG. 14 is a bottom perspective view of a d assembly of e vacuum laminator of FIG. 5.

FIG. 14 is a bottom perspective view of the third assembly 80 of the vacuum laminator 30 of FIG. 5. Referring to FIGS. 5 and 14, the third assembly 80 comprises a second elevational member 81. The second elevational support member 81 comprises a vacuum passage 102, which can be coupled with a vacuum source 100. The third assembly 80 further comprises a base 82 that is coupled to a first plate 83, e.g., a diaphragm plate, by spacers 85. As shown, the spacers 85 are posts positioned at the corners of the base 82 and the first plate 83. The third assembly 80 further comprises a second plate 84, e.g., an airstroke cylinder plate, which is coupled to the first plate 83 by spacers 86. The spacers 86 may be positioned at the corners of the second plate 84 and the first plate 83. One or more airstroke cylinders 87 are positioned between the first plate 83 and the second plate 84, and are used to keep a downward force applied to the third assembly 80 to counterbalance the large forces that are generated when the diaphragm 31 is pressurized. The airstroke cylinders 87 expand when filled with gas and shrink when emptied. In one embodiment, the airstroke cylinders 87 contain gaseous nitrogen. In one embodiment, the diaphragm 31 comprises rubber to prevent sharp edges from puncturing it, while allowing good vacuum lamination. An embodiment of the third assembly 80 may comprise one or more heating elements so that the diaphragm 31 can be pre-heated before coming into contact with the backsheet 22 (FIG. 13).

Referring again to FIG. 5, the fourth assembly 90 is a support assembly and comprises one or more support members 91 that position one or more rails 92, 93 above a surface that supports one or more of the components 60, 70 and 80 of the vacuum laminator 30. A first rail 92 is an optoelectronic device placement rail that is coupled with a first elevational support 61. The purpose of the first rail 92 is to constrain and guide lateral movement of the optoelectronic device placement assembly 60 between a first position that is over an optoelectronic device placement plate 69, which holds one or more spaced-apart optoelectronic devices in pockets 125 (FIG. 6) and a second position that is over the second assembly 70. The second rail 93 is a lamination assembly rail that is coupled with the lamination assembly 80. The purpose of the second rail 93 is to constrain and guide lateral movement of the lamination assembly 80 between a first position that is removed from the second assembly 70 and a second position that is over the second assembly 70.

Manufacture and use embodiments of the vacuum laminator 30 and/or lamination techniques described herein can provide large area, hermetic encapsulation of optoelectronic devices.

With reference to FIG. 2 and following, the backsheet 22, optoelectronic devices 20 and the front sheet 21, are not components of the vacuum laminator 30, but rather materials and/or objects upon which the vacuum laminator 30 operates to produce rigid or flexible encapsulated optoelectronic devices having improved resistance to cracking and/or contamination by oxygen, water or other species.

Figure 15A:
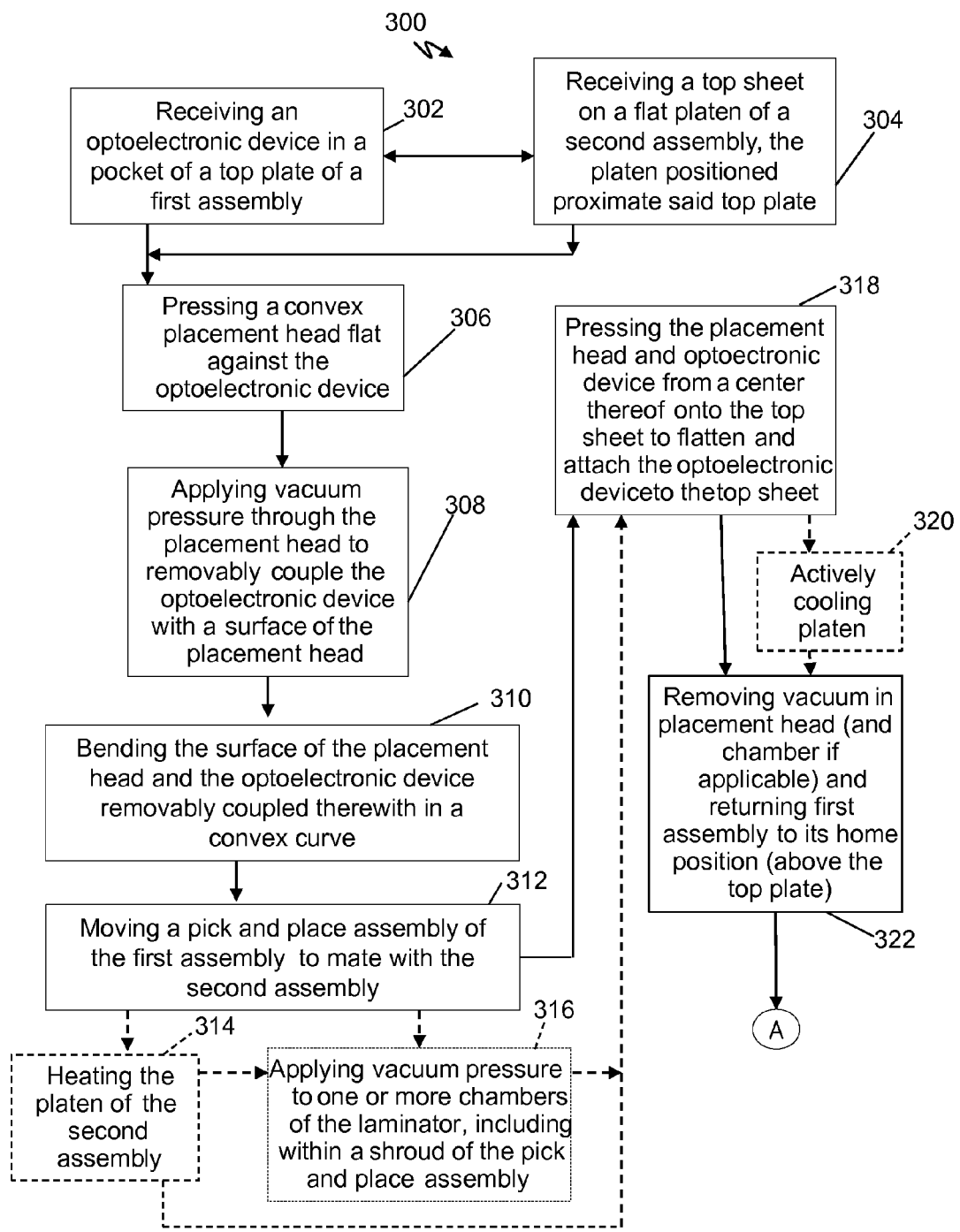
FIGS. 15A and 15B are an embodiment of a method that may be used to hermetically seal one or more optoelectronic devices using an embodiment of the vacuum laminator of FIG. 5.
Figure 15B:
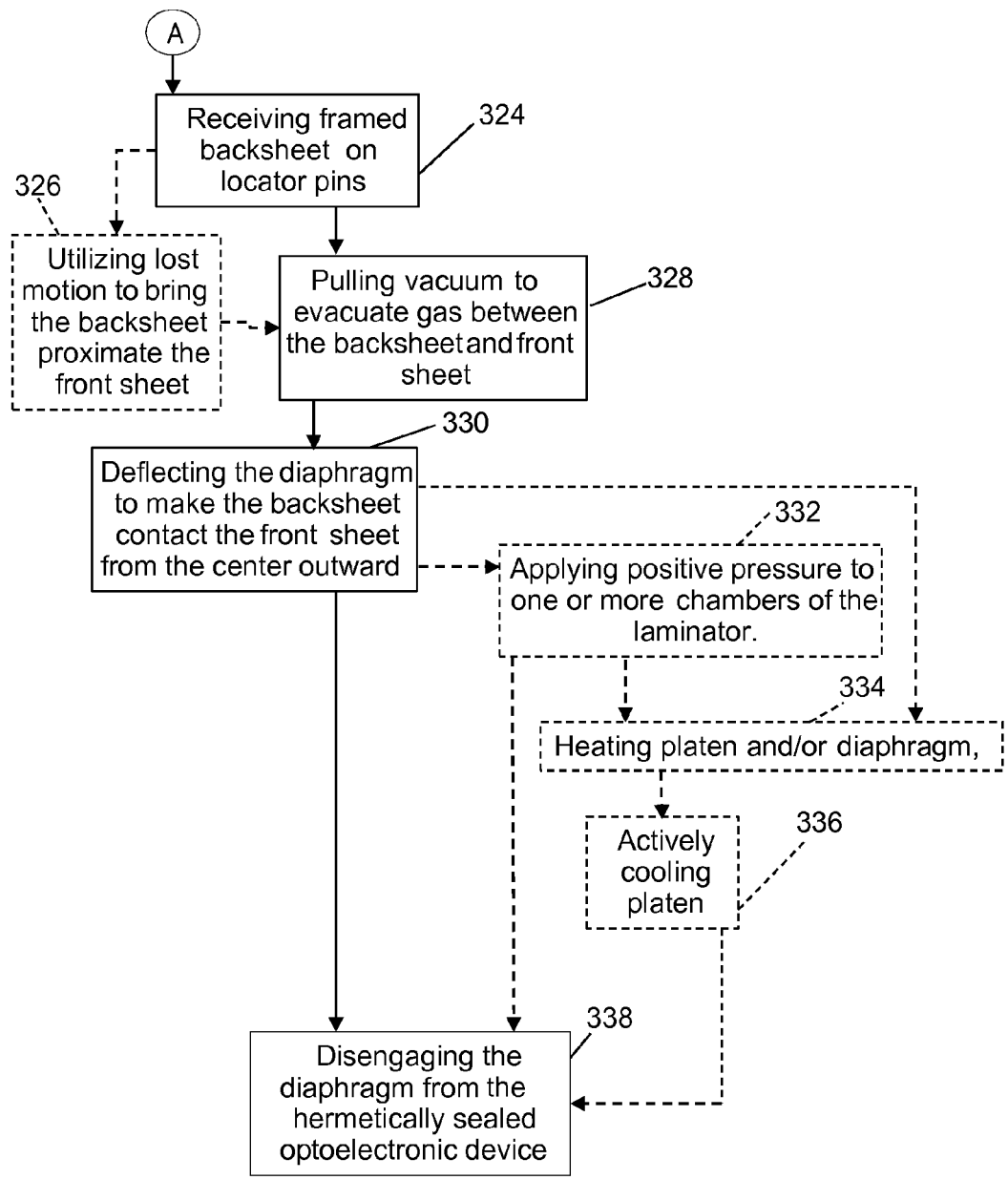

FIGS. 15A and 15B are a flowchart illustrating an embodiment of a new method 300 for hermetically encapsulating one or more optoelectronic devices. The reference numbers used in describing elements and/or features of the method 300 can be found in one or more of FIGS. 2, 3, 4, 5, 6, 7, 8, 10, 11, 12, 13, 14, 15A and 15B. Unless otherwise indicated, one or more of elements of the method 300 may be performed concurrently and/or in any suitable order. Embodiments of the method 300 are intended to be performed at or in a dry area, such as a dry box or a dry room, that is filled with a purified gas, such as nitrogen or argon, so that the presence of oxygen and/or moisture are minimized as much as possible. It is contemplated that embodiments of the method 300 will be performed by at least an embodiment of the vacuum laminator 30.

The method 300 may begin by performing any of the two functions represented by blocks 302 and 304. For illustrative purposes only, the method 300 will be described beginning with block 302, which represents receiving an optoelectronic device 20 in a pocket 125 of a top plate 69 of a first assembly 60. The optoelectronic device 20 may be placed in the pocket 125 by a person or a machine, such as a robot.

As represented by block 304, the method 300 further comprises receiving a front sheet 21 on a flat platen 26 of a second assembly 70, wherein the platen 26 is positioned proximate the top plate 69, as previously shown and described.

As represented by block 306, the method 300 further comprises repressing a convex placement head 66 flat against the optoelectronic device 20, as previously shown and described. Any of the first assembly 60, second assembly 70 and third assembly 80 may be movable with respect to each other. In one embodiment, the second assembly 70 is stationary, and the first assembly 60 and the third assembly 80 move relative to the second assembly 70.

As represented by block 308, the method 300 further comprises applying vacuum pressure through the placement head 66 to removably couple the optoelectronic device 20 with a flexible surface of the placement head 66.

As represented by block 310, the method 300 further comprises bending the flexible surface of the placement head 66 and the optoelectronic device 20 removably coupled therewith in a convex curve.

As represented by block 312, the method 300 further comprises moving a pick and place assembly 62 of the first assembly 60 to mate with the second assembly 70, as described above. Thereafter, the method 300 may proceed directly to any of blocks 314, 316 and 318.

As represented b block 314, the method 300 may further comprise heating the platen 26 of the second assembly 70 As represented by block 316, the method 300 may further comprise applying vacuum pressure to one or more chambers of the laminator, including with a shroud of the pick and place assembly 62.

As represented by block 318, the method 300 further comprises pressing the placement head 66 and the optoelectronic device 20 from a center 130 thereof onto the front sheet 21 to flatten and attach the optoelectronic device 20 to the front sheet 21. Thereafter, the method 300 may proceed to block 320 or to block 322.

As represented by block 320, the method 300 further comprises actively cooling the platen 26.

As represented by block 322, the method 300 further comprises removing the vacuum from the placement head 66 (and the shroud chamber, if applicable). This step may further include returning the first assembly to its home position (above the top plate 69).

As represented b block 324, the method 300 receiving a framed backsheet 22 on the one more locator pins. Thereafter, the method 300 may proceed to block 326 or block 328.

As represented by block 326, the method 300 may further comprise utilizing lost motion to bring the backsheet 22 proximate the front sheet 21.

As represented by block 328, the method 300 further comprises pulling a vacuum to evacuate gas between the backsheet 22 and the front sheet 21.

As represented by block 330, the method 300 may further comprise deflecting the diaphragm to make the backsheet 22 contact the front sheet 21 from the center outward. Thereafter, the method 300 may proceed to block 332, block 334 or block 338.

As represented by block 332, the method 300 may further comprise applying positive pressure to one or more chambers of the laminator. Thereafter, the method 300 may proceed to block 334 or block 338.

As represented by block 334, the method 300 may further comprise heating the platen 26 and/or the diaphragm 31. Thereafter, the method 300 may proceed to block 336.

As represented by Hock 336, the method 300 may further comprise actively cooling the platen 26.

As represented by block 338, the method may further comprise disengaging the diaphragm 31 from the hermetically sealed optoelectronic device 20, 40.

Thereafter, the method 300 may end.

As used herein, an element or function recited in the singular and preceded with the word "a" or "an" should be understood as not excluding plural said elements or functions, unless such exclusion is explicitly recited. Furthermore, references to "one embodiment" of the claimed invention should not be interpreted as excluding the existence of additional embodiments that also incorporate the recited features.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the scope of the following claims.

What is claimed is:

1. A method, comprising:
temporarily affixing an optoelectronic device to a placement head using a first vacuum that is pulled through the placement head, wherein the placement head can move from a first convex shape to a second flat shape;
placing the optoelectronic device with the placement head onto a front sheet, the front sheet being positioned on a flat surface of a platen; and
applying a compressive force to a diaphragm to couple a backsheet with the front sheet and the optoelectronic device.

2. The method of claim 1, wherein the optoelectronic device is one of an OLED and a photovoltaic device.

3. A method, comprising:
receiving an optoelectronic device at a first assembly;
receiving a sheet of encapsulating material on a platen of a second assembly, the platen having a flat surface and being positioned proximate the first assembly; and
pressing a convex placement head against the optoelectronic device without gas bubble entrapment.

4. The method of claim 3, further comprising:
pressing a shroud that surrounds the convex placement head against the platen of the second assembly,
wherein the convex placement head has a first limit of travel and wherein the shroud has a second limit of travel that is different so that the optoelectronic device can be picked and placed using lost motion.

5. The method of claim 3, further comprising:
applying vacuum pressure through the placement head to removably couple the optoelectronic device with a surface of the placement head.

6. The method of claim 5, further comprising:
bending the surface of the placement head and optoelectronic device removably coupled therewith in a convex curve.

7. The method of claim 6, further comprising:
moving a pick and place assembly of the first assembly to mate with the second assembly; and
applying vacuum pressure to one or more chambers, including within a shroud of the pick and place assembly.

8. The method of claim 7, further comprising:
heating the platen.

9. The method of claim 7, further comprising:
pressing the placement head and the optoelectronic device from a center thereof onto the sheet of encapsulating material to flatten and attach the optoelectronic device thereto.

10. The method of claim 9, further comprising:
applying pressure to a chamber beneath the platen to counter-balance a compressive force applied to the platen.

11. The method of claim 7, wherein the vacuum pressure is applied to the one or more chambers before lamination.

12. The method of claim 3, wherein the optoelectronic device is one of an OLED and a photovoltaic device.

13. The method of claim 3, wherein the sheet of encapsulating material is one of a front sheet and a back sheet.

* * * * *

UNITED STATES PATENT AND TRADEMARK OFFICE
CERTIFICATE OF CORRECTION

PATENT NO. : 8,865,487 B2
APPLICATION NO. : 13/237360
DATED : October 21, 2014
INVENTOR(S) : Kostka et al.

It is certified that error appears in the above-identified patent and that said Letters Patent is hereby corrected as shown below:

In the Specification

In Column 1, Line 16, delete "transparent in" and insert -- transparent. In --, therefor.

In Column 1, Line 57, delete "below 110" and insert -- below 10 --, therefor.

In Column 2, Lines 51-52, delete "conventional" and insert -- conventional roll --, therefor.

In Column 2, Line 62, delete "fiat" and insert -- flat --, therefor.

In Column 4, Line 13, delete "d assembly of e" and insert -- third assembly of the --, therefor.

In Column 4, Line 32, delete "fiat" and insert -- flat --, therefor.

In Column 4, Line 63, delete "of optoelectronic" and insert -- of an optoelectronic --, therefor.

In Column 5, Line 1, delete "uni-directionat," and insert -- uni-directional, --, therefor.

In Column 5, Line 30, delete "toads" and insert -- loads --, therefor.

In Column 5, Line 37, delete "slim" and insert -- sum --, therefor.

In Column 6, Line 2, delete "edges" and insert -- edges of --, therefor.

In Column 6, Line 17, delete "By way," and insert -- By way --, therefor.

In Column 6, Line 40, delete "film (ACT)" and insert -- film (ACF) --, therefor.

In Column 6, Line 48, delete "film (ACT)" and insert -- film (ACF) --, therefor.

Signed and Sealed this
Twenty-second Day of September, 2015

Michelle K. Lee
*Director of the United States Patent and Trademark Office*

CERTIFICATE OF CORRECTION (continued)
U.S. Pat. No. 8,865,487 B2

In Column 6, Line 53, delete "aft" and insert -- all --, therefor.

In Column 7, Line 18, delete "the factor" and insert -- the fill factor --, therefor.

In Column 7, Line 46, delete "elevation at" and insert -- elevational --, therefor.

In Column 8, Line 16, delete "white" and insert -- while --, therefor.

In Column 9, Line 3, delete "abase 117" and insert -- a base 117 --, therefor.

In Column 9, Line 8, delete "affix" and insert -- affix an --, therefor.

In Column 9, Line 25, delete "returning" and insert -- referring --, therefor.

In Column 11, Line 22, delete "8, 10," and insert -- 8, 9, 10, --, therefor.

In Column 11, Line 65, delete "b block" and insert -- by block --, therefor.

In Column 11, Line 66, delete "assembly 70As" and insert -- assembly 70. As --, therefor.

In Column 12, Line 17, delete "b block" and insert -- by block --, therefor.

In Column 12, Line 38, delete "Hock 336," and insert -- block 336, --, therefor.